United States Patent
Niimi et al.

(10) Patent No.: US 8,828,825 B2
(45) Date of Patent: Sep. 9, 2014

(54) METHOD OF SUBSTANTIALLY REDUCING THE FORMATION OF SIGE ABNORMAL GROWTHS ON POLYCRYSTALLINE ELECTRODES FOR STRAINED CHANNEL PMOS TRANSISTORS

(75) Inventors: Hiroaki Niimi, Dallas, TX (US); James Joseph Chambers, Dresden (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/550,494

(22) Filed: Jul. 16, 2012

(65) Prior Publication Data

US 2014/0017866 A1    Jan. 16, 2014

(51) Int. Cl.
*H01L 21/336*     (2006.01)

(52) U.S. Cl.
USPC ........... 438/285; 438/595; 438/199; 438/289; 257/190; 257/329; 257/369; 257/412; 257/206

(58) Field of Classification Search
CPC ................................ H01L 21/00; H01L 29/00
USPC ......... 438/199, 231, 224, 203, 228, 154, 230, 438/289, 202, 207, 238, 266
See application file for complete search history.

(56) References Cited

U.S. PATENT DOCUMENTS

| | | | |
|---|---|---|---|
| 2005/0269672 A1* | 12/2005 | Visokay | 257/635 |
| 2007/0196970 A1* | 8/2007 | Niimi et al. | 438/197 |
| 2012/0028431 A1* | 2/2012 | Niimi et al. | 438/303 |

* cited by examiner

*Primary Examiner* — Telly Green
(74) *Attorney, Agent, or Firm* — Jacqueline J. Garner; Frederick J. Telecky, Jr.

(57) ABSTRACT

The likelihood of forming silicon germanium abnormal growths, which can be undesirably formed on the gate electrode of a strained-channel PMOS transistor at the same time that silicon germanium source and drain regions are formed, is substantially reduced by using protection materials that reduce the likelihood that the gate electrode is exposed during the formation of the silicon germanium source and drain regions.

20 Claims, 19 Drawing Sheets

METHOD OF SUBSTANTIALLY REDUCING THE FORMATION OF SIGE ABNORMAL GROWTHS ON POLYCRYSTALLINE ELECTRODES FOR STRAINED CHANNEL PMOS TRANSISTORS

BACKGROUND OF THE INVENTION

1. Field of the Invention

The present invention relates to strained-channel PMOS transistors and, more particularly, to a method of substantially reducing the formation of SiGe abnormal growths on polycrystalline electrodes for strained-channel PMOS transistors.

2. Description of the Related Art

A MOS transistor is a well-known semiconductor device that includes spaced-apart source and drain regions, which are separated by a channel, and a gate that lies over and insulated from the channel. MOS transistors can be formed as n-channel (NMOS) devices or as p-channel (PMOS) devices.

FIG. 1 shows a cross-sectional view that illustrates a prior-art PMOS transistor 100. As shown in FIG. 1, PMOS transistor 100 includes a semiconductor body 110. Semiconductor body 110, in turn, includes an n-type single-crystal-silicon substrate region 112, and spaced-apart p-type single-crystal-silicon source and drain regions 114 and 116 that touch substrate region 112. Source region 114 and drain region 116 each include a heavily-doped (p+) region and a lightly-doped (p−) region.

Semiconductor body 110 further includes a channel portion 120 of substrate region 112 that lies between and touches the p-type source and drain regions 114 and 116. In addition, semiconductor body 110 includes a shallow trench isolation (STI) region 122 that touches substrate region 112 and the p-type source and drain regions 114 and 116.

As further shown in FIG. 1, PMOS transistor 100 also includes a gate insulation region 130 that lies over channel portion 120, and a polycrystalline silicon (poly-Si) gate 132 that lies on gate insulation region 130 over channel portion 120. Further, transistor 100 includes a non-conductive side wall spacer 134 that laterally surrounds poly gate 132.

In operation, when a negative drain-to-source voltage $V_{DS}$ is present, and the gate-to-source voltage $V_{GS}$ is more negative than the threshold voltage, PMOS transistor 100 turns on and holes flow from source region 114 to drain region 116. When the gate-to-source voltage $V_{GS}$ is more positive than the threshold voltage, PMOS transistor 100 turns off and no holes (other than a very small leakage current) flow from source region 114 to drain region 116.

To enhance the mobility of the holes that flow from the source region to the drain region, advanced devices utilize a strained-channel PMOS transistor in lieu of a conventional PMOS transistor, such as PMOS transistor 100. Strained-channel PMOS transistors, in turn, utilize silicon germanium (SiGe) source and drain regions in lieu of the single-crystal-silicon source and drain regions utilized by conventional PMOS transistors.

FIG. 2 shows a cross-sectional view that illustrates a prior-art strained-channel PMOS transistor 200. PMOS transistor 200 is similar to PMOS transistor 100 and, as a result, utilizes the same reference numerals to designate the elements which are common to both of the PMOS transistors.

As shown in FIG. 2, one significant way that PMOS transistor 200 differs from PMOS transistor 100 is that PMOS transistor 200 replaces substantial portions of the p-type single-crystal-silicon source and drain regions 114 and 116 with p-type SiGe source and drain regions 210 and 212. The SiGe source and drain regions 210 and 212 introduce strain into channel portion 120, which increases the hole mobility when PMOS transistor 200 is turned on.

One problem with strained-channel PMOS transistor 200 is that the conventional approach to forming PMOS transistor 200 is susceptible to the formation of SiGe abnormal growths on the poly-Si gate electrodes. The SiGe abnormal growths, which can be undesirably formed when the SiGe source and drain regions 210 and 212 are epitaxially grown, degrade device yield.

FIGS. 3A-3L show a series of cross-sectional views that illustrate a prior-art method 300 of forming a strained-channel PMOS transistor. As shown in FIG. 3A, method 300 utilizes a semiconductor body 310 which has been conventionally formed to have an n-type single-crystal-silicon substrate region 312, a gate isolation region 314 that touches substrate region 312, and a shallow trench isolation region (STI) 316 that touches and extends into substrate region 312, and laterally surrounds gate isolation region 314. Gate isolation region 314 can be implemented with, for example, silicon dioxide ($SiO_2$) or silicon oxynitride (SiON).

As further shown in FIG. 3A, method 300 begins by forming a polycrystalline (poly) layer 320 on gate isolation region 314 and STI region 316 in a conventional manner. Poly layer 320 can be implemented with, for example, undoped polycrystalline silicon or undoped polycrystalline silicon germanium. After poly layer 320 has been formed, an inorganic anti-reflective coating (IARC) layer 324 is conventionally formed on poly layer 320. Next, a patterned photoresist layer 326 is formed on the top surface of IARC layer 324 in a conventional fashion.

As shown in FIG. 3B, after patterned photoresist layer 326 has been formed, the exposed region of IARC layer 324 is conventionally etched to form an IARC hard mask 330. After IARC hard mask 330 has been formed, patterned photoresist layer 326 is removed in a conventional manner using, for example, oxygen or fluorine ashing. Following this, the resulting structure is cleaned to remove organics, such as with a wet etch (e.g., a Piranha etch) or a dry etch.

As shown in FIG. 3C, following the removal of patterned photoresist layer 326, the exposed regions of poly layer 320 and gate isolation region 314 are anisotropically etched in a conventional fashion. The etch forms a stacked structure 331 that touches substrate region 312. Stacked structure 331 includes IARC hard mask 330, a poly gate electrode 334 which touches and lies below IARC hard mask 330, and a gate insulation region 336 that touches and lies between gate electrode 334 and substrate region 312. As a result of gate insulation region 336, poly gate electrode 334 is electrically isolated from substrate region 312.

After this, as shown in FIG. 3D, a non-conductive layer 340 is formed to touch substrate region 312, STI region 316, IARC hard mask 330, gate electrode 334, and gate insulation region 336. Non-conductive layer 340 can be implemented with, for example, an oxide layer or an oxide-nitride-oxide (ONO) layer.

As shown in FIG. 3E, once non-conductive layer 340 has been formed, non-conductive layer 340 is anisotropically etched in a conventional manner. Following the anisotropic etch, the remaining portion of non-conductive layer 340 is isotropically etched with an etchant, such as dilute hydrofluoric acid (dHF), to form a non-conductive side wall spacer 342 that touches the side wall of poly gate electrode 334. In some cases, as shown by the arrow A in FIG. 3E, the dHF etch can remove a top portion of side wall spacer 342 and expose a significant portion of the side wall of IARC hard mask 330.

As shown in FIG. 3F, after side wall spacer 342 has been formed, a p-type dopant is implanted into substrate region 312 and driven in using conventional procedures to form single-crystal-silicon PLDD source and drain regions 344 and 345. Next, a protection layer 346 is formed to touch STI region 316, IARC hard mask 330, side wall spacer 342, and the PLDD regions 344 and 345.

Protection layer 346 can be implemented with, for example, a nitride layer, and formed in a conventional low-temperature manner using, for example, hexachlorodisilane (HCD) or tertiary-butylamino silane (BTBAS) processes. Once protection layer 346 has been formed, a patterned photoresist layer 348 is formed on protection layer 346. (Patterned photoresist layer 348 protects other areas of the wafer from the subsequent etch of protection layer 346.)

Following this, as shown in FIG. 3G, protection layer 346 is anisotropically etched in a conventional manner to form a non-conductive side wall spacer 350. In addition, the etch exposes spaced-apart regions of the single-crystal-silicon PLDD regions 344 and 345. In some cases, as shown by the arrow B in FIG. 3G, variations in the manufacturing process, such as the non-uniform deposition of protection layer 346, can cause the etch to undesirably re-expose a significant portion of the side wall of IARC hard mask 330.

As shown in FIG. 3H, after side wall spacer 350 has been formed, the exposed portions of the single-crystal-silicon PLDD regions 344 and single-crystal-silicon substrate region 312 are anisotropically etched to form source and drain trenches 352 and 354. Once the source and drain trenches 352 and 354 have been formed, patterned photoresist layer 348 is removed.

Next, as shown in FIG. 3I, the exposed portions of single-crystal-silicon in the source and drain trenches 352 and 354 are wet etched to form source and drain cavities 356 and 358. As further shown in FIG. 3I, a channel portion 359 of the single-crystal-silicon substrate region 312 lies horizontally between the source and drain cavities 356 and 358. Channel portion 359, in turn, lies directly below poly gate electrode 334.

Following this, as shown in FIG. 3J, p-type silicon germanium is epitaxially grown in a conventional manner to form p-type SiGe source and drain regions 360 and 362 in the source and drain cavities 356 and 358. Next, as shown in FIG. 3K, IARC hard mask 330, protection layer 346, and side wall spacer 350 are removed in a conventional manner to form a strained-channel PMOS transistor 370.

One of the problems with the conventional formation of strained-channel PMOS transistors, such as PMOS transistor 370, is that, due in part to the undesirable exposure of the side wall region of IARC hard mask 330, IARC hard mask 330 can partially chip or lift off from gate electrode 334, thereby exposing a portion of gate electrode 334.

When this occurs, as shown in FIG. 3L, a SiGe abnormal growth 372 is undesirably formed on the exposed region of gate electrode 334 at the same time that the SiGe source and drain regions 360 and 362 are formed. SiGe abnormal growths 372 can lead to the formation of defective transistors. As a result, there is a need for a method of substantially reducing the formation of SiGe abnormal growths.

SUMMARY OF THE INVENTION

The present invention provides a method of substantially reducing the formation of SiGe abnormal growths on polycrystalline gate electrodes. The method of the present invention forms a polycrystalline (poly) layer on a gate isolation structure, where the gate isolation structure touches and lies above a single-crystal silicon region. The method also performs a plasma nitridation to convert a surface of the poly layer to silicon nitride. The method further etches a number of layers to form a stacked structure. The number of layers includes the poly layer with the surface converted to silicon nitride. The stacked structure includes a poly gate electrode that is formed by etching the poly layer, and a silicon nitride cap that is formed by etching the surface converted to silicon nitride. The poly gate electrode has a side wall. The silicon nitride cap touches and lies above the poly gate electrode.

The method of the present invention alternately forms a poly layer on a gate isolation structure, where the gate isolation structure touches and lies above a single-crystal silicon region. The alternate method also forms a protective layer to touch and lie above the poly layer, and an inorganic anti-reflective coating (IARC) layer to touch and lie above the protective layer. The protective layer and the IARC layer include different materials. In addition, the alternate method etches a number of layers to form a stacked structure. The number of layers includes the poly layer, the protective layer, and the IARC layer. The stacked structure includes a poly gate electrode that is formed by etching the poly layer, a protective cap that is formed by etching the protective layer, and an IARC hard mask that is formed by etching the IARC layer. The poly gate electrode has a side wall. The protective cap touches and lies above the poly gate electrode. The IARC hard mask touches and lies above the protective cap. Further, the alternate method etches the single-crystal silicon region to form a source cavity and a drain cavity after the stacked structure has been formed. The source cavity lies spaced apart from the drain cavity. A channel portion of the single-crystal silicon region lies horizontally between the source cavity and the drain cavity. The channel portion lies directly below the poly gate electrode. Additionally, the alternate method simultaneously grows a silicon germanium source region in the source cavity, and a silicon germanium drain region in the drain cavity.

The method of the present invention also alternatively forms a stacked structure that touches a single-crystal silicon region. The stacked structure includes a poly gate electrode that is electrically isolated from the single-crystal silicon region. The poly gate electrode has a side wall. The alternative method also forms a non-conductive side wall spacer that touches the side wall of the poly gate electrode, and a non-conductive side wall structure that touches the non-conductive side wall spacer. In addition, the alternative method performs a plasma nitridation such that any exposed surface of the poly gate electrode is converted to a silicon nitride layer, and etches the silicon nitride layer to remove the silicon nitride layer from the single-crystal silicon region.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 4A:
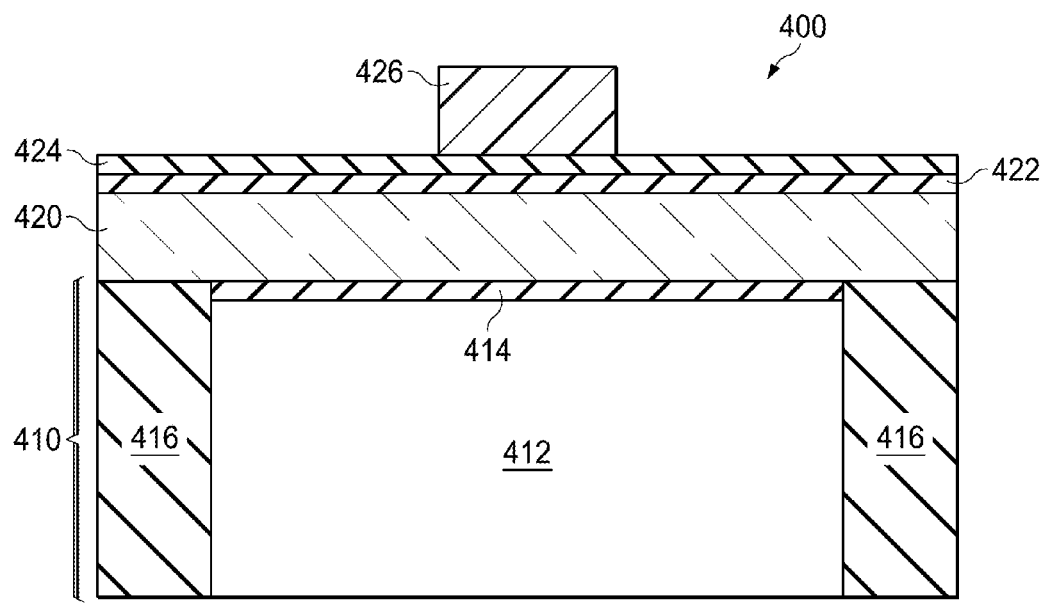
FIGS. 4A-4K are a series of cross-sectional views illustrating an example of a method 400 of forming a strained-channel PMOS transistor in accordance with the present invention.

FIGS. 4A-4K show a series of cross-sectional views that illustrate an example of a method 400 of forming a strained-channel PMOS transistor in accordance with the present invention. As shown in FIG. 4A, method 400 utilizes a single-crystal silicon body 410 which has been conventionally formed to have an n-type single-crystal-silicon substrate region 412, a gate isolation region 414 that touches substrate region 412, and a shallow trench isolation region (STI) 416 that touches and extends into substrate region 412, and laterally surrounds gate isolation region 414. Gate isolation region 414 can be implemented with, for example, $SiO_2$ or SiON.

As further shown in FIG. 4A, method 400 begins by forming a polycrystalline (poly) layer 420 on gate isolation region 414 and STI region 416 in a conventional manner. Poly layer 420 can be implemented with, for example, undoped polycrystalline silicon or undoped polycrystalline silicon germanium. After poly layer 420 has been formed, a protection layer 422 is formed on poly layer 420.

Protection layer 422 can be implemented with, for example, a silicon nitride layer, and formed using, for example, a low-temperature plasma nitridation process that converts a surface of poly layer 420 to silicon nitride. For example, the plasma nitridation process can be performed at room temperature with no intentional wafer heating at a pressure in the range of 10-75 mTorr, radio frequency (RF) power in the range of 500-1000 W based on plasma excited by an RF wave in the frequency range of 10-20 KHz, and an $N_2$ flow in the range of 50-500 sccm.

Alternately, the plasma nitridation process can be performed at a temperature in the range of 300-400° C. with no intentional wafer heating at a pressure in the range of 50-200 mT, microwave power in the range of 1000-1500 W based on plasma excited by a microwave in the frequency range of 2-3 GHz, and an argon flow in the range of 800-1200 sccm.

Both of the plasma nitridation processes form a nitride layer with a high concentration of nitrogen (e.g., greater than $1 \times 10^{16}/cm^2$) within 2 nm from the top surface. Following the formation of protection layer 422, a protection layer 424 is conventionally formed on protection layer 422. Protection layer 424 has different materials than protection layer 422, and can be implemented with, for example, an inorganic anti-reflective coating (IARC) layer.

Next, a patterned photoresist layer 426 is formed on the top surface of protection layer 424. Patterned photoresist layer 426 is formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

Figure 4B:
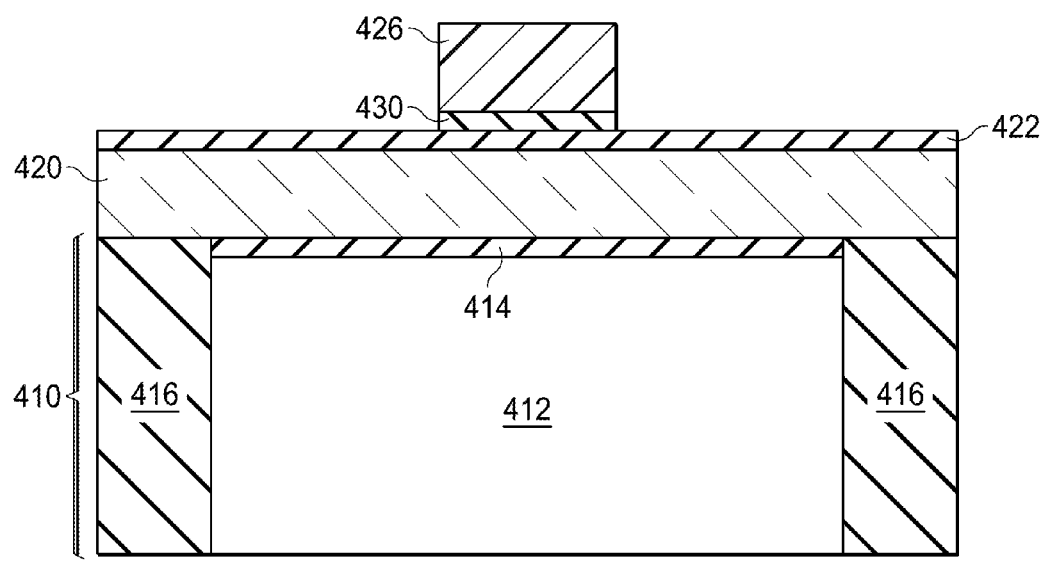

As shown in FIG. 4B, after patterned photoresist layer 426 has been formed, the exposed region of protection layer 424 is conventionally etched to form a protection cap 430 that functions as hard mask. After protection cap 430 has been formed, patterned photoresist layer 426 is removed in a conventional manner using, for example, oxygen or fluorine ashing. Following this, the resulting structure is cleaned to remove organics, such as with a wet etch (e.g., a Piranha etch) or a dry etch.

Figure 4C:
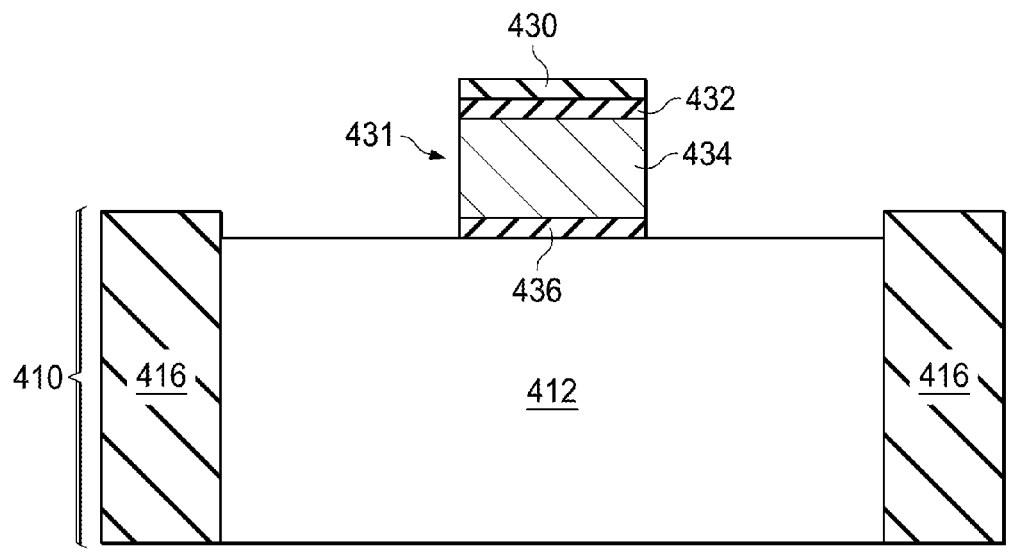

As shown in FIG. 4C, following the removal of patterned photoresist layer 426, the exposed regions of protection layer 422, poly layer 420, and gate isolation region 414 are etched to form a stacked structure 431 that touches substrate region 412. Stacked structure 431 includes a protection cap 430, a protection cap 432 that touches and lies below protection cap 430, a poly gate electrode 434 that touches and lies below protection cap 432, and a gate insulation region 436 that lies between gate electrode 434 and substrate region 412.

Figure 4D:
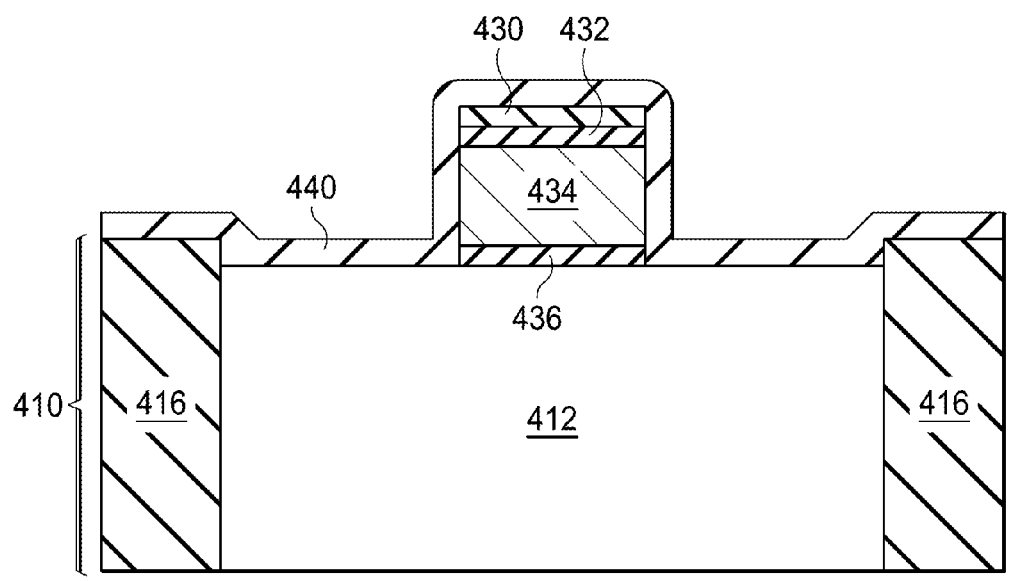

After this, as shown in FIG. 4D, a non-conductive layer 440 is formed to touch substrate region 412, STI region 416, protection cap 430, protection cap 432, gate electrode 434, and gate insulation region 436. Non-conductive layer 440 can be implemented with, for example, an oxide layer or an oxide-nitride-oxide (ONO) layer.

Figure 4E:
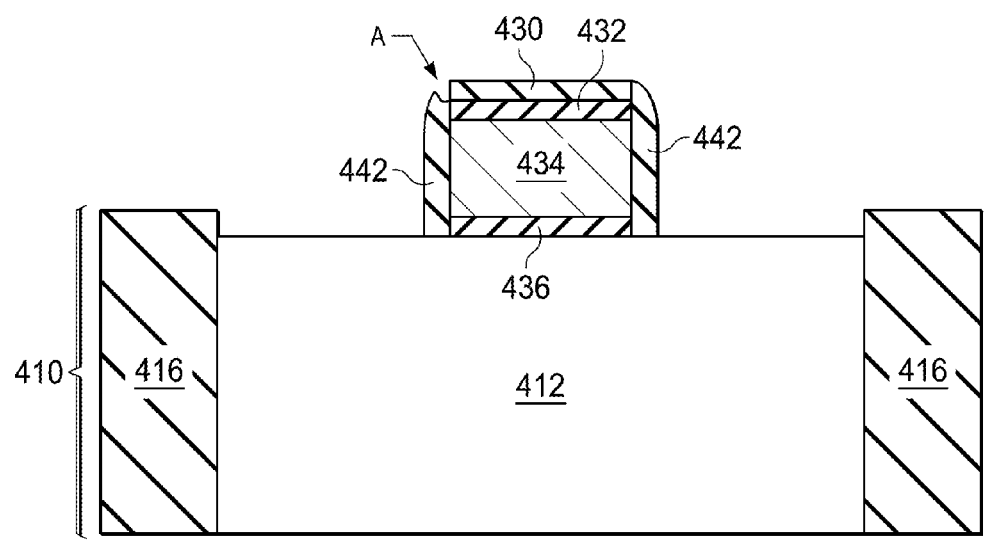

As shown in FIG. 4E, once non-conductive layer 440 has been formed, non-conductive layer 440 is anisotropically etched in a conventional manner. Following the anisotropic etch, the remaining portion of non-conductive layer 440 is isotropically etched with an etchant, such as dilute hydrofluoric acid (dHF), to form a non-conductive side wall spacer 442 that touches the side wall of poly gate electrode 434. In the present example, side wall spacer 442 also touches the side wall of protection cap 432. In some cases, as shown by the arrow A in FIG. 4E, the dHF etch can remove a top portion of side wall spacer 442 and expose a significant portion of the side wall of protection cap 430.

Figure 4F:
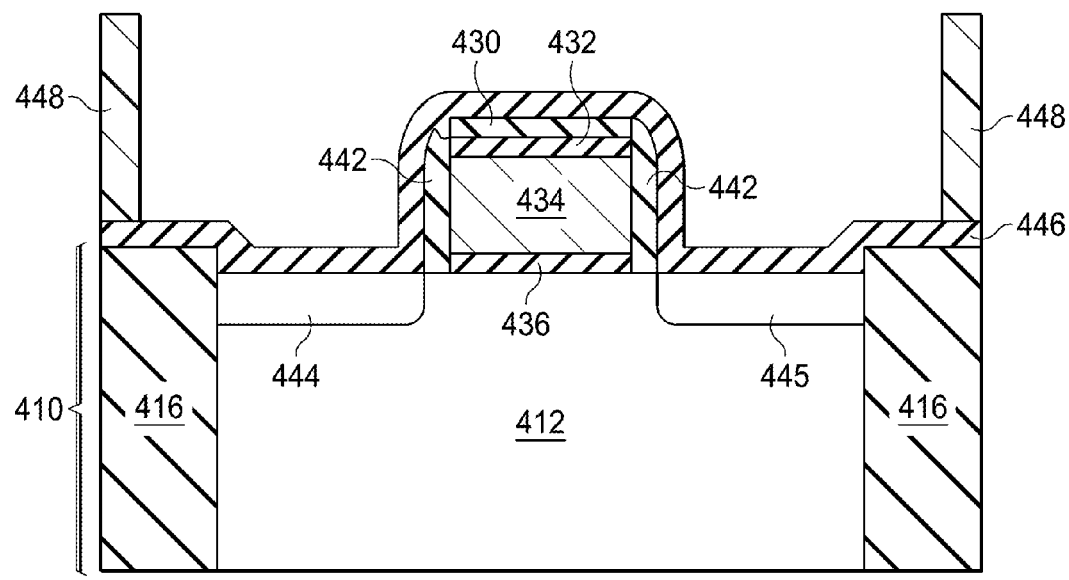

As shown in FIG. 4F, after side wall spacer 442 has been formed, a p-type dopant is implanted into substrate region 412 and driven in using conventional procedures to form single-crystal-silicon PLDD source and drain regions 444 and 445. Next, a protection layer 446 is formed to touch STI region 416, protection cap 430, side wall spacer 442, and the PLDD regions 444 and 445.

Protection layer 446 can be implemented with, for example, a nitride layer, and formed in a conventional low-temperature manner using, for example, hexachlorodisilane (HCD) or tertiary-butylamino silane (BTBAS) processes. Once protection layer 446 has been formed, a patterned photoresist layer 448 is formed on protection layer 446. (Patterned photoresist layer 448 protects other areas of the die from the subsequent etch of protection layer 446.)

Figure 4G:
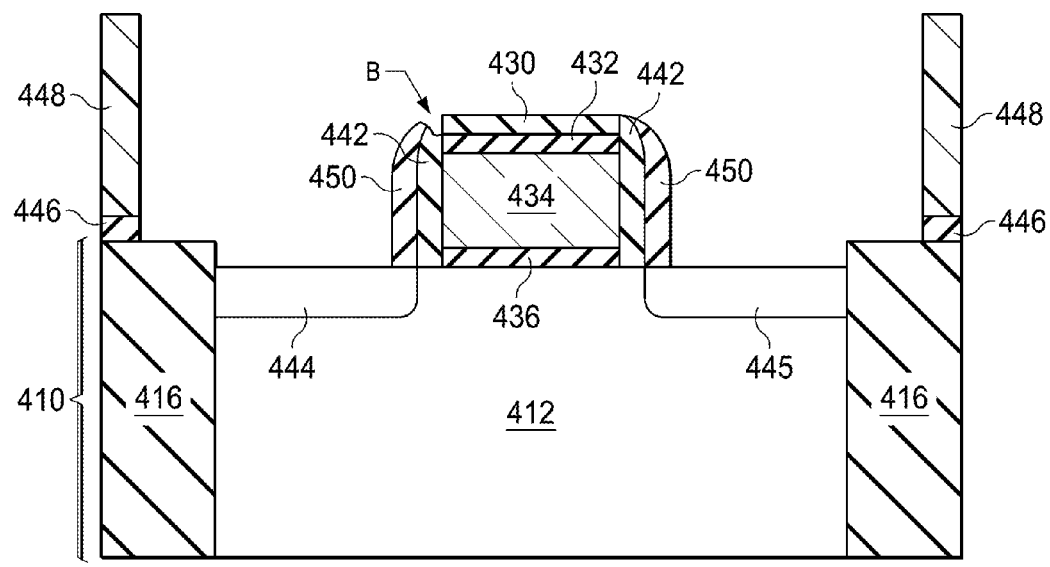

Following this, as shown in FIG. 4G, protection layer 446 is anisotropically etched in a conventional manner to form a side wall spacer 450. The etch also exposes spaced-apart regions of the single-crystal-silicon PLDD regions 444 and 445. In some cases, as shown by the arrow B in FIG. 4G, variations in the manufacturing process, such as the non-uniform deposition of protection layer 446, can cause the etch to undesirably re-expose a significant portion of the side wall of protection cap 430.

Figure 4H:
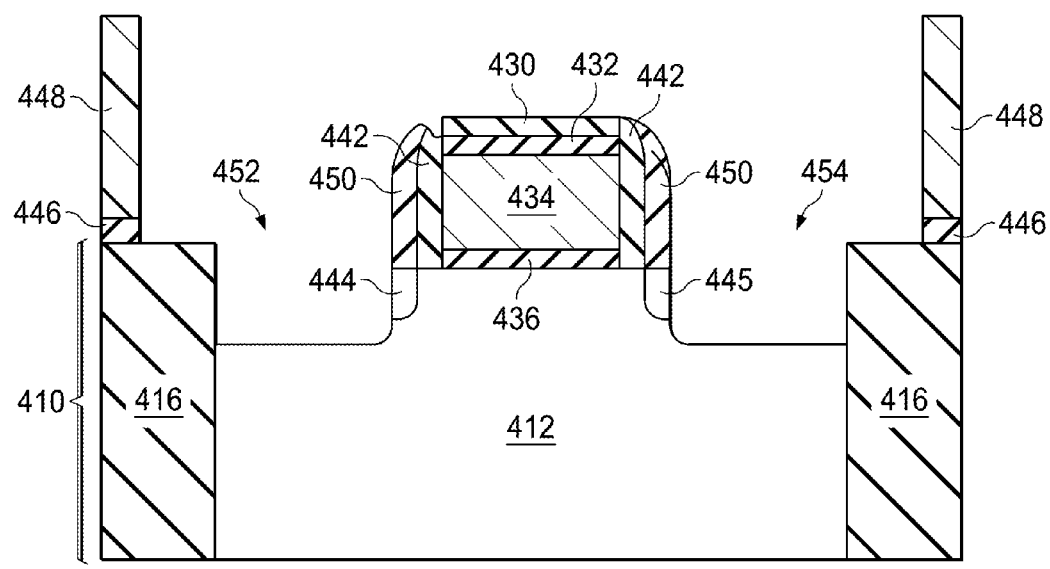

As shown in FIG. 4H, after side wall spacer 450 has been formed, the exposed portions of the single-crystal-silicon PLDD regions 444 and 445, and single-crystal-silicon substrate region 412 are anisotropically etched to form source and drain trenches 452 and 454. Once the source and drain trenches 452 and 454 have been formed, patterned photoresist layer 448 is removed in a conventional manner.

Figure 4I:
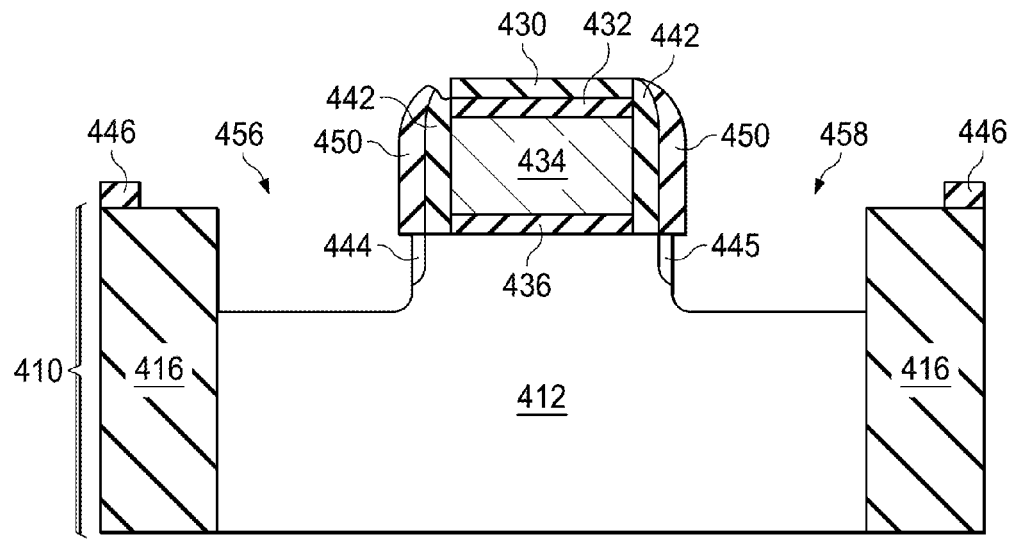
Figure 4J:
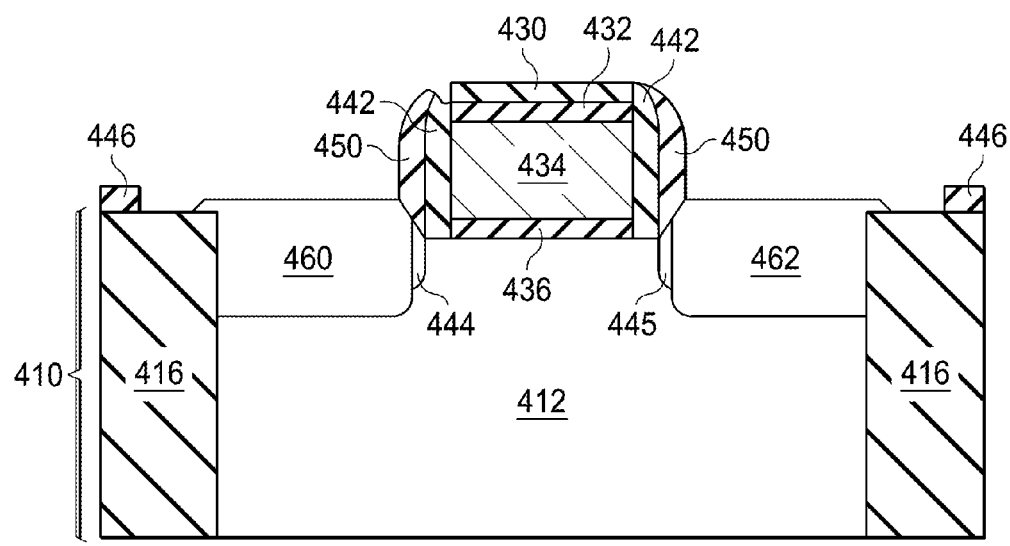
Figure 4K:
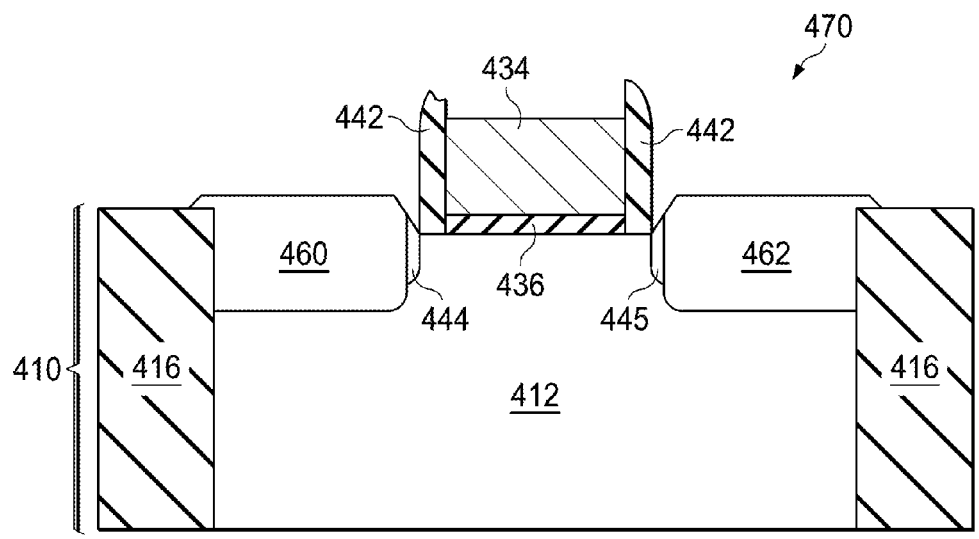

Next, as shown in FIG. 4I, the exposed portions of single-crystal-silicon in the source and drain trenches 452 and 454 are conventionally wet etched to form source and drain cavities 456 and 458. The cavities 456 and 458 are then rinsed and cleaned in a conventional fashion. Following this, as shown in FIG. 4J, p-type silicon germanium is epitaxially grown in the cavities 456 and 458 in a conventional manner to form p-type SiGe source and SiGe drain regions 460 and 462. Next, as shown in FIG. 4K, protection cap 430, protection cap 432, protection layer 446, and side wall spacer 450 are removed in a conventional manner to form a strained-channel PMOS transistor 470.

One of the advantages of method 400 is that even if protection cap 430 partially chips or lifts off, which can be due to the exposure of a significant portion of the side wall of protection cap 430 or other factors, protection cap 432 covers and protects gate electrode 434, thereby preventing the formation of a SiGe abnormal growth on gate electrode 434 during the formation of the SiGe source and drain regions 460 and 462. Another advantage of method 400 is that protection layer 422, which is used to form protection cap 432, can be deposited in a low-temperature process.

Figure 1:
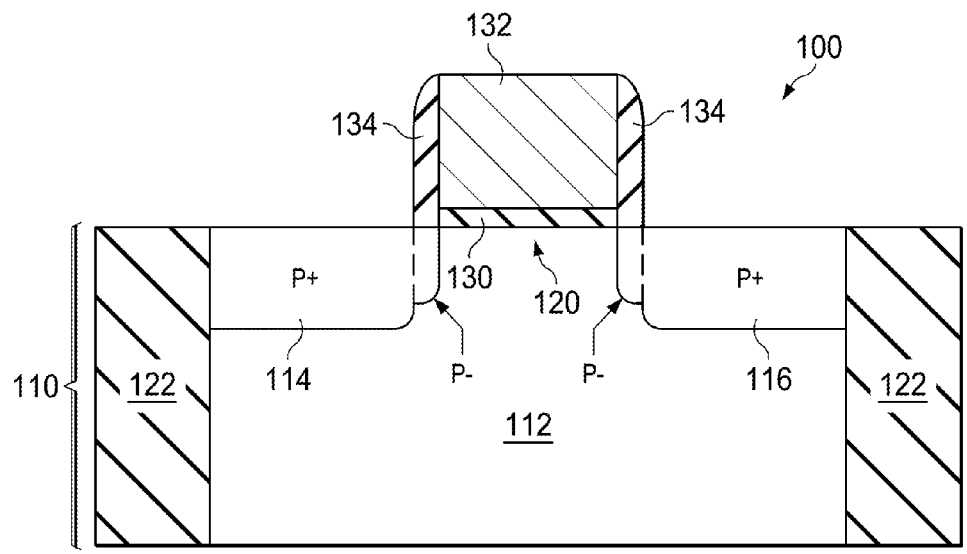
FIG. 1 is a cross-sectional view illustrating a prior-art PMOS transistor 100.
Figure 2:
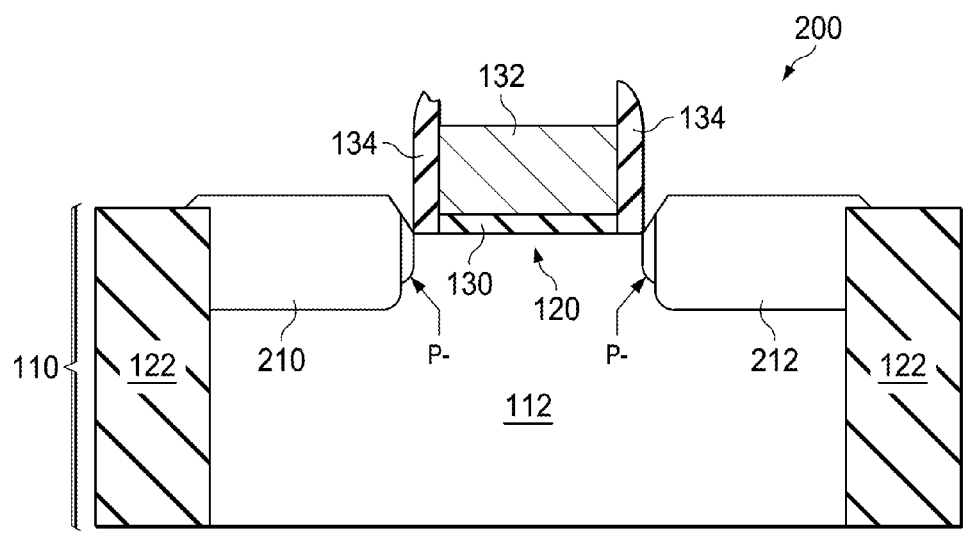
FIG. 2 is a cross-sectional view illustrating a prior-art strained-channel PMOS transistor 200.
Figure 3A:
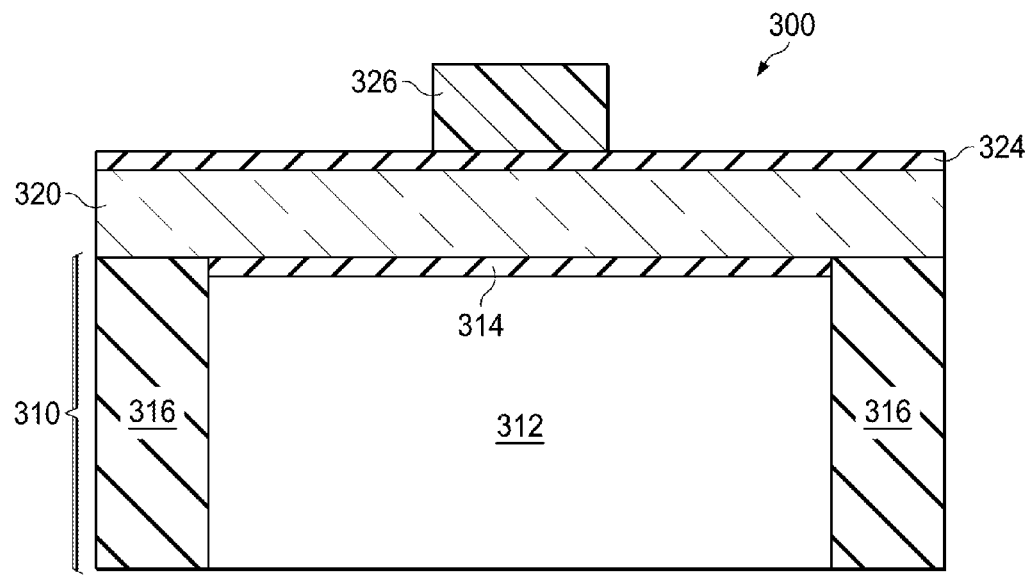
FIGS. 3A-3L are a series of cross-sectional views illustrating a prior-art method 300 of forming a strained-channel PMOS transistor.
Figure 3B:
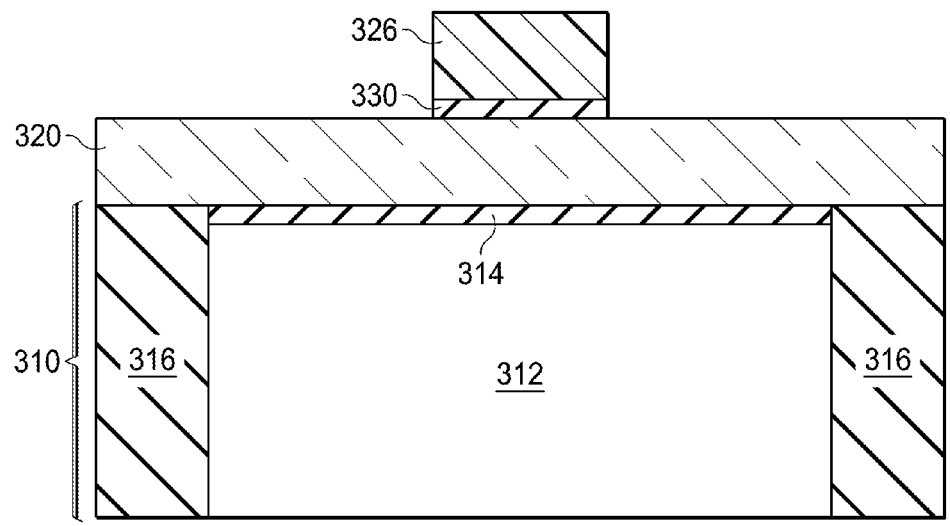
Figure 3C:
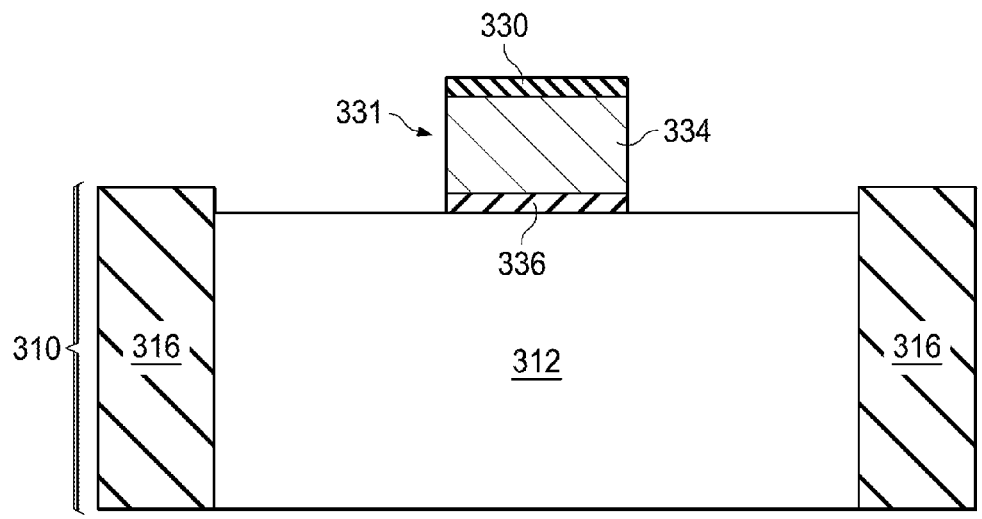
Figure 3D:
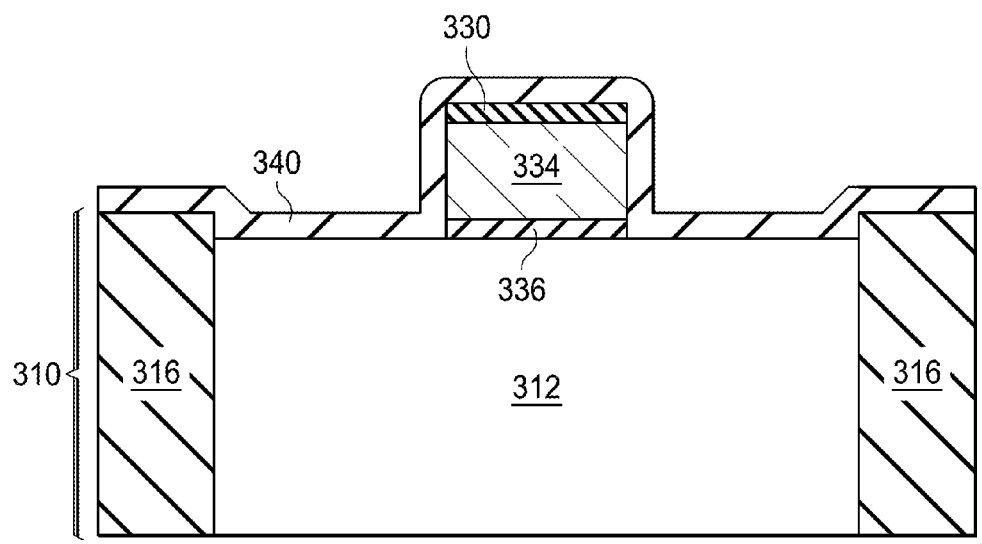
Figure 3E:
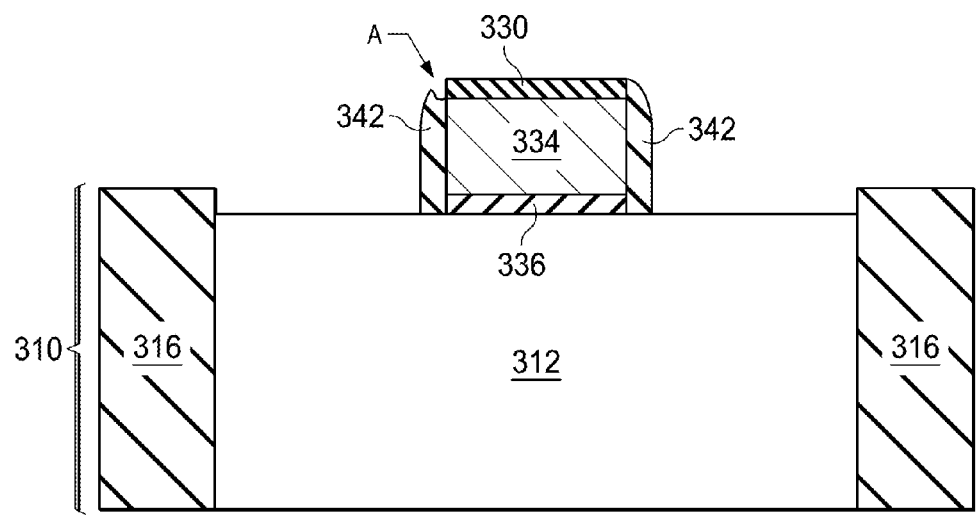
Figure 3F:
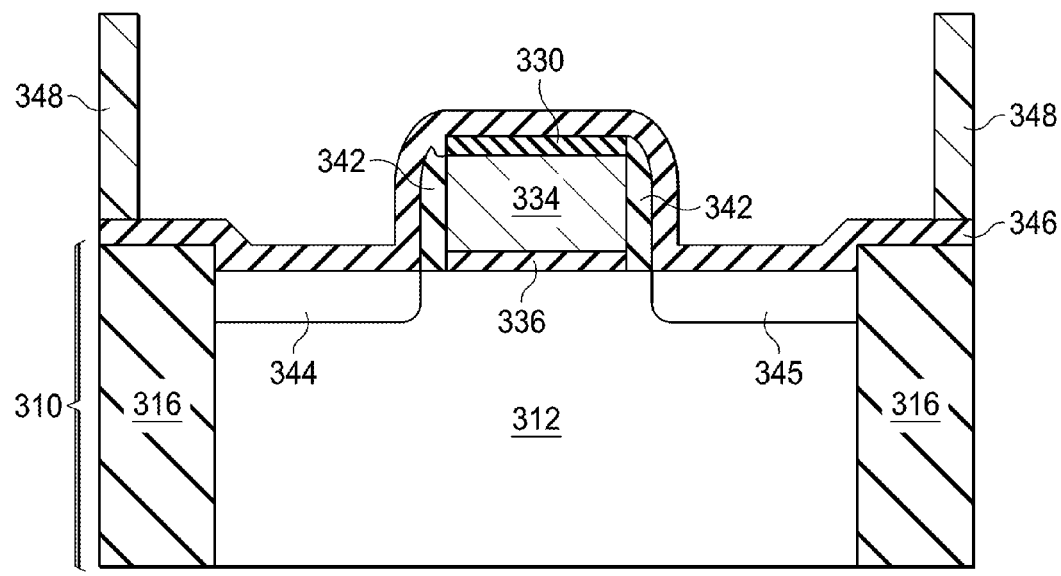
Figure 3G:
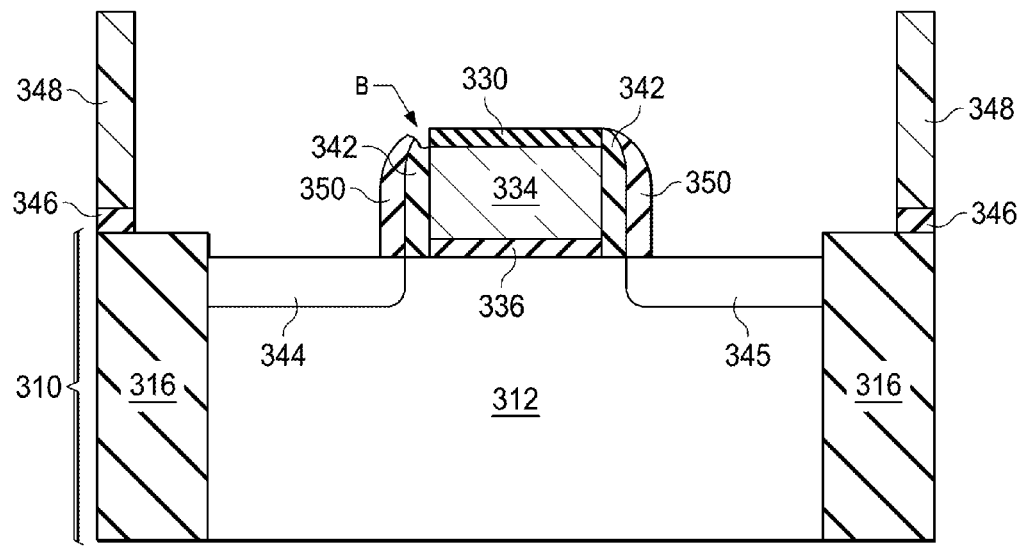
Figure 3H:
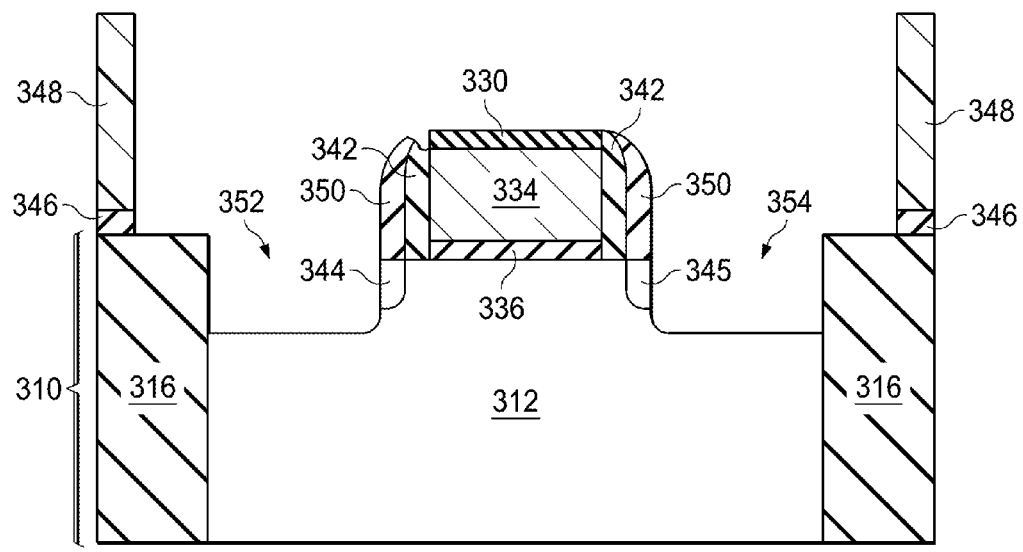
Figure 3I:
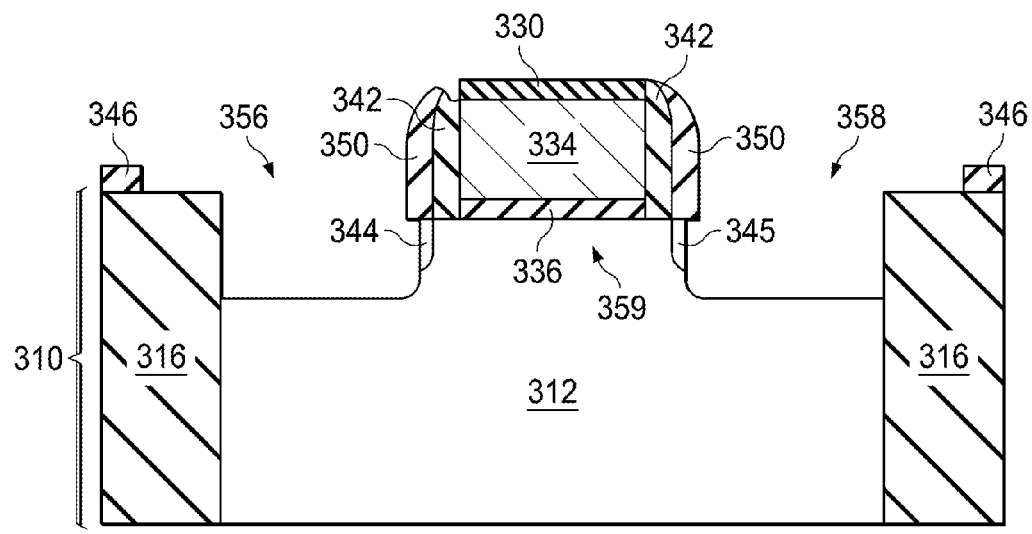
Figure 3J:
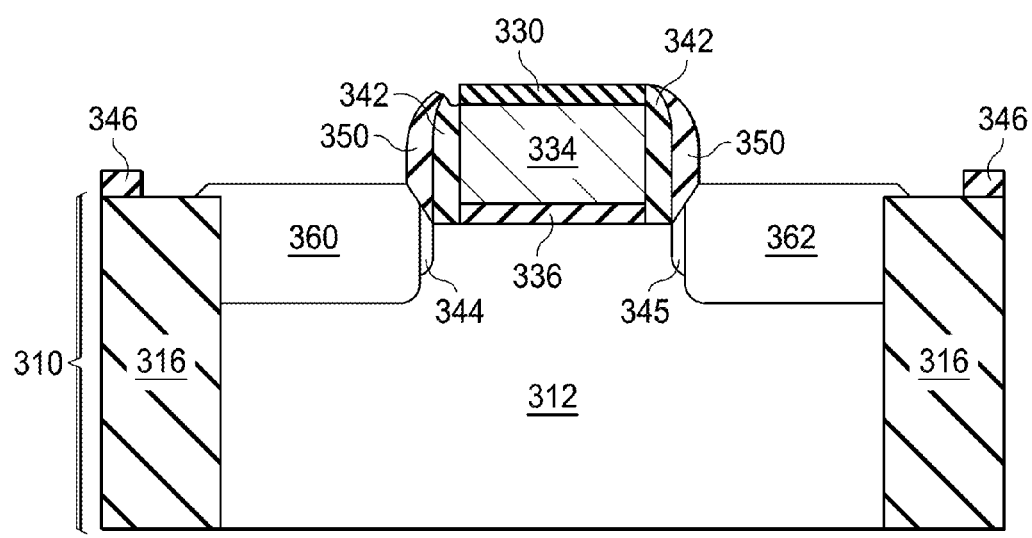
Figure 3K:
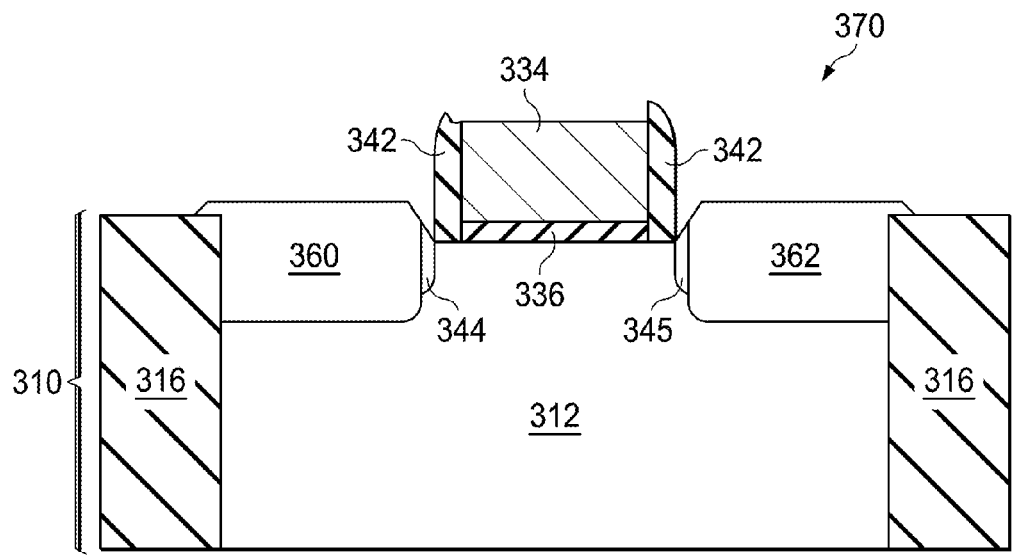
Figure 3L:
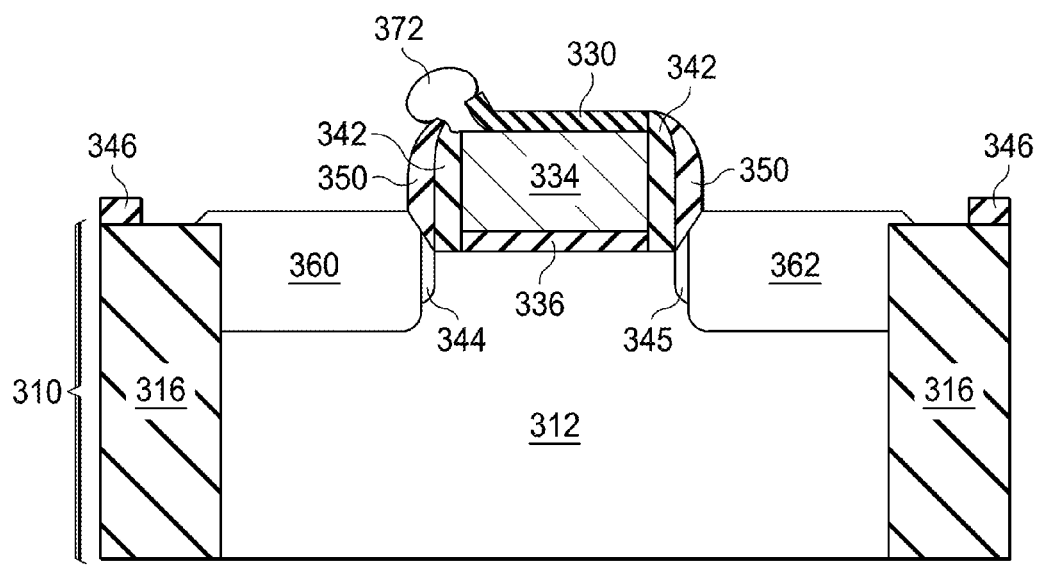

FIGS. 5A-5F show a series of cross-sectional views that illustrate an example of a method 500 of forming a strained-channel PMOS transistor in accordance with the present invention. Method 500 is the same as method 300 up through the anisotropic etch of protection layer 346 shown in FIG. 3F to form side wall spacer 350 shown in FIG. 3G.

Figure 5A:
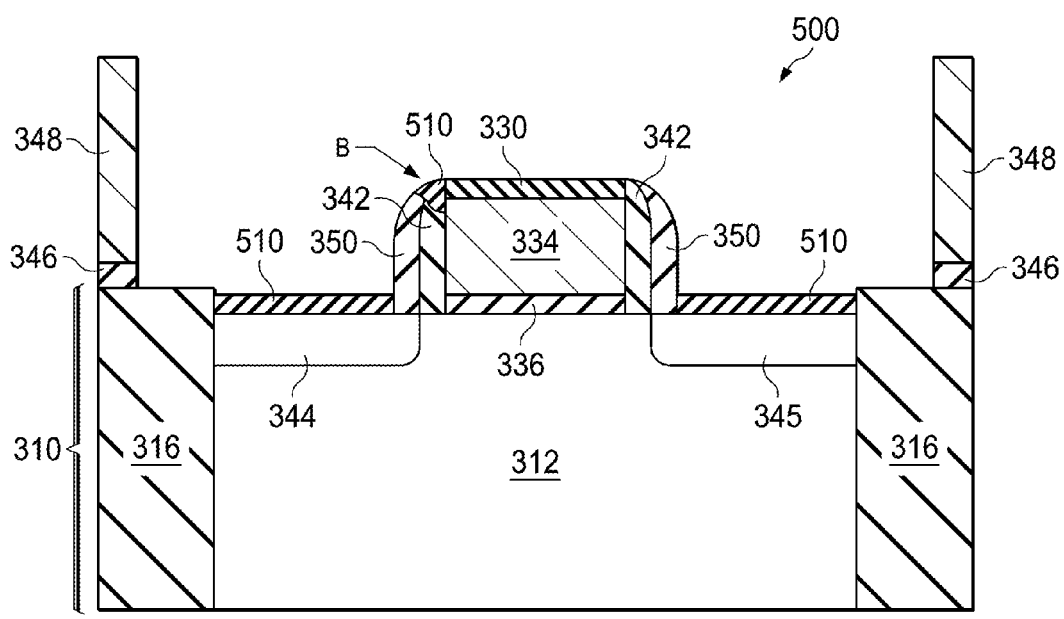
FIGS. 5A-5F are a series of cross-sectional views illustrating an example of a method 500 of forming a strained-channel PMOS transistor in accordance with the present invention.

As shown in FIG. 5A, method 500 then differs from method 300 in that after side wall spacer 350 has been formed, method 500 forms a number of protection regions 510 to touch the PLDD regions 344 and 345. The protection regions 510 can be implemented with, for example, a silicon nitride layer, and formed using, for example, the low-temperature plasma nitridation process used to form protection layer 422.

As further shown in FIG. 5A, when a surface of poly gate electrode 334 is exposed by an opening following the formation of side wall spacer 350, which is illustrated by the arrow B in FIG. 5A, a protection region 510 touches the exposed surface of poly gate electrode 334 in the opening illustrated by the arrow B.

Figure 5B:
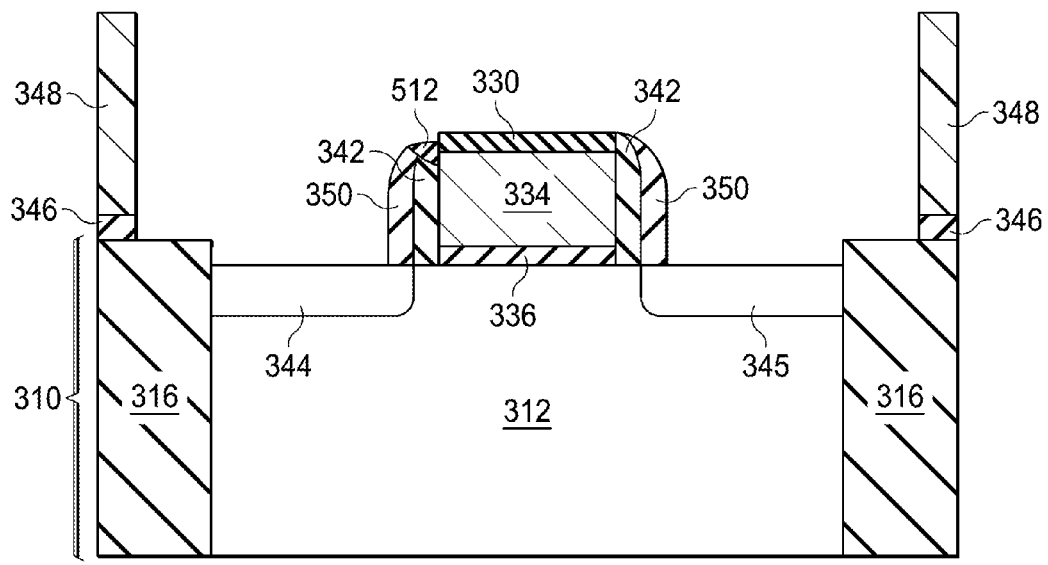

Following this, as shown in FIG. 5B, the protection regions 510 are anisotropically etched in a conventional manner. When the opening illustrated by the arrow B is present, the etch removes the protection regions 510 from the PLDD regions 344 and 345, and forms a protection region 512 that touches the exposed surface of poly gate electrode 334 in the opening illustrated by the arrow B, thereby protecting the exposed surface of poly gate electrode 334. In addition, protection region 512 also touches the side wall of IARC hard mask 330 and side wall spacer 342. On the other hand, when a surface of poly gate electrode 334 is not exposed, the etch removes substantially all of the protection regions 510.

Figure 5C:
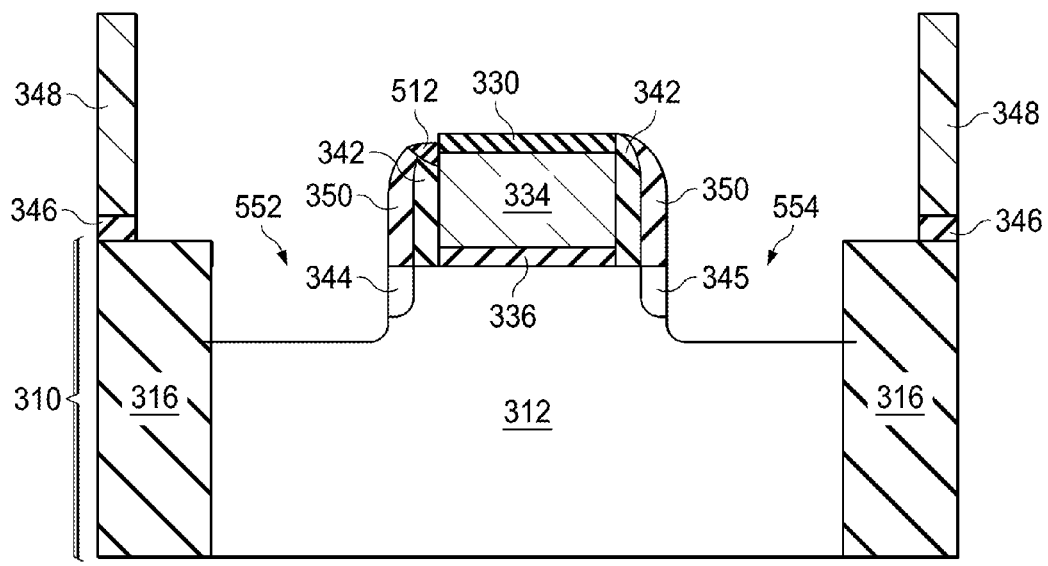

As shown in FIG. 5C, after protection region 512 has been formed, the exposed portions of the single-crystal-silicon PLDD regions 344 and single-crystal-silicon substrate region 312 are anisotropically etched in a conventional manner to form source and drain trenches 552 and 554. Once the source and drain trenches 552 and 554 have been formed, patterned photoresist layer 348 is removed in a conventional fashion.

Figure 5D:
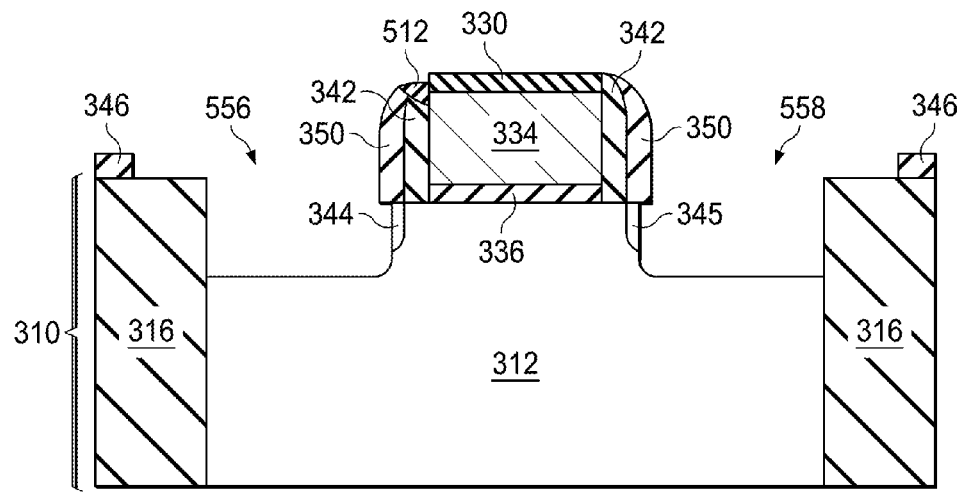
Figure 5E:
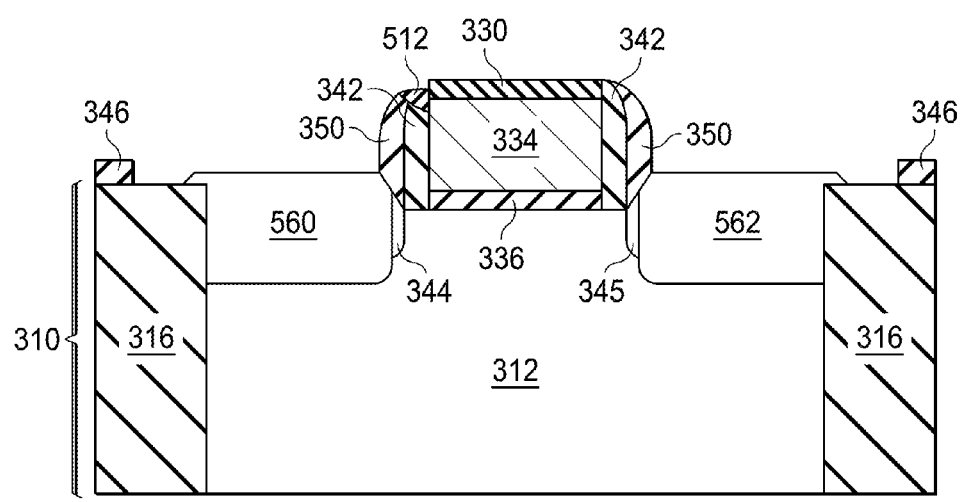
Figure 5F:
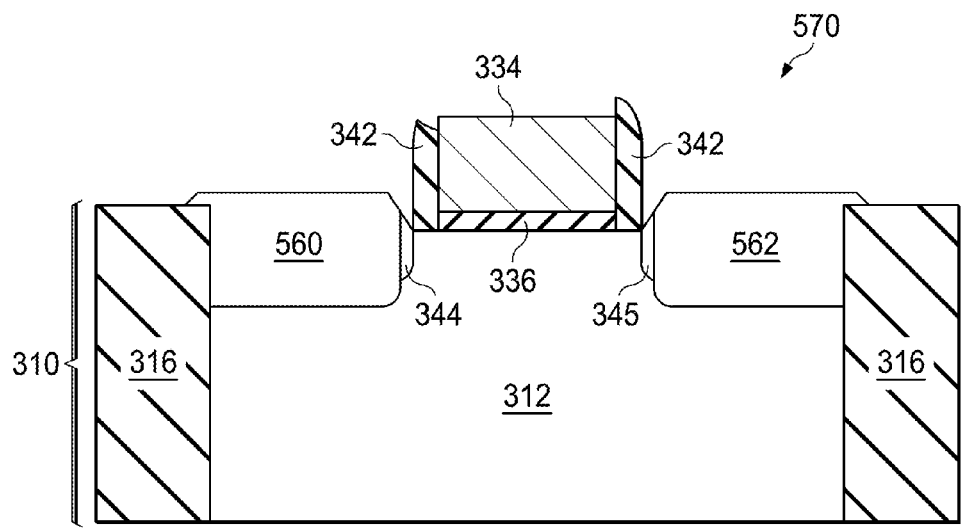

Next, as shown in FIG. 5D, the exposed portions of single-crystal-silicon in the source and drain trenches 552 and 554 are conventionally wet etched to form source and drain cavities 556 and 558. The cavities 556 and 558 are then rinsed and cleaned in a conventional fashion. Following this, as shown in FIG. 5E, p-type silicon germanium is epitaxially grown in a conventional manner to form p-type SiGe source and drain regions 560 and 562 in the source and drain cavities 556 and 558. Next, as shown in FIG. 5F, IARC hard mask 330, protection layer 346, side wall spacer 350, and protection region 512 are removed in a conventional manner to form a strained-channel PMOS transistor 570.

One of the advantages of method 500 is that when the side wall of IARC hard mask 330 is undesirably exposed, protection region 512 covers and protects some if not all of the exposed portion of the side wall of IARC hard mask 330. As a result, the likelihood that IARC hard mask 330 will partially chip or lift off and expose gate electrode 334 during the formation of the SiGe source and drain regions 560 and 562 is substantially reduced. Another advantage of method 500 is that protection layer 510, which is used to form protection region 512, can be deposited in a low-temperature process.

FIGS. 6A-6F show a series of cross-sectional views that illustrate an example of a method 600 of forming a strained-channel PMOS transistor in accordance with the present invention. Method 600 is the same as method 400 up through the anisotropic etch of protection layer 446 shown in FIG. 4F to form side wall spacer 450 shown in FIG. 4G.

Figure 6A:
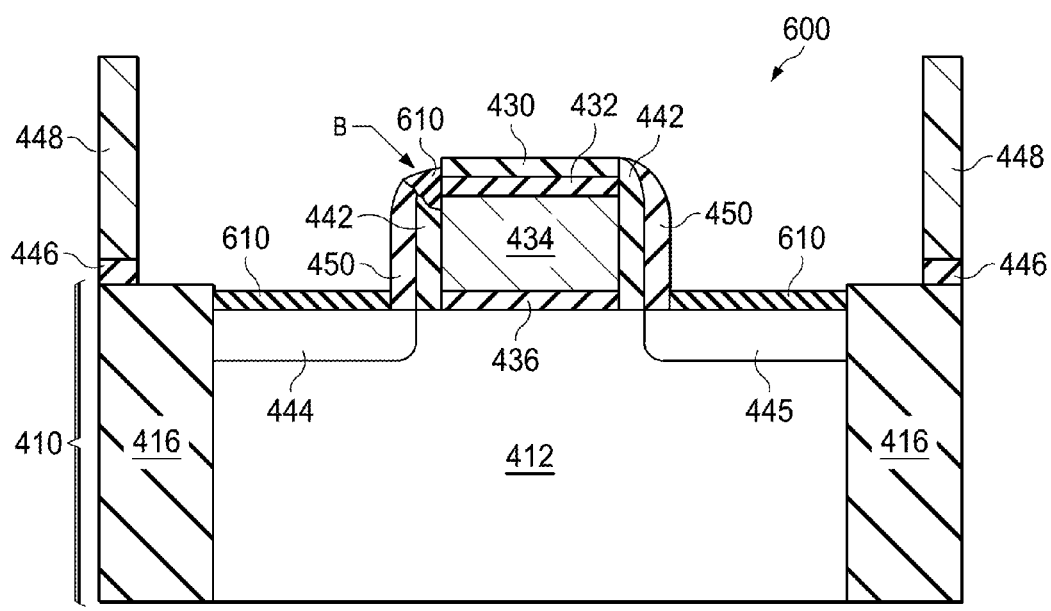
FIGS. 6A-6F are a series of cross-sectional views illustrating an example of a method 600 of forming a strained-channel PMOS transistor in accordance with the present invention.

As shown in FIG. 6A, method 600 then differs from method 400 in that after side wall spacer 450 has been formed, method 600 forms a number of protection regions 610 to touch the PLDD regions 444 and 445. The protection regions 610 can be implemented with, for example, silicon nitride, and formed using, for example, the low-temperature plasma nitridation process used to form protection layer 422.

As further shown in FIG. 6A, when a surface of poly gate electrode 434 is exposed by an opening following the formation of side wall spacer 450, which is illustrated by the arrow B in FIG. 6A, a protection region 610 touches the exposed surface of poly gate electrode 434 in the opening illustrated by the arrow B.

Figure 6B:
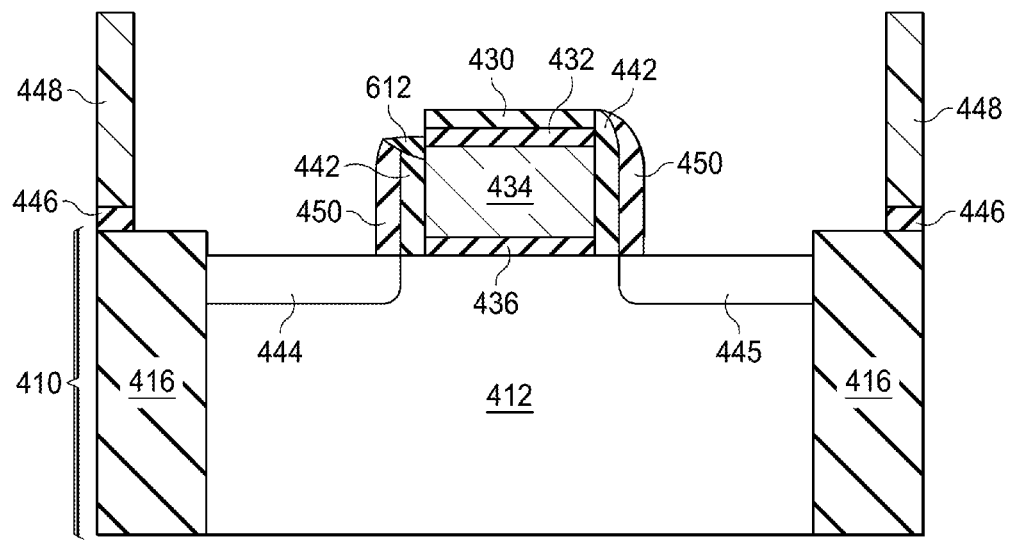

Following this, as shown in FIG. 6B, the protection regions 610 are anisotropically etched in a conventional manner. When the opening illustrated by the arrow B is present, the etch removes the protection regions 610 from the PLDD regions 444 and 445, and forms a protection region 612 that touches the exposed surface of poly gate electrode 434 in the opening illustrated by the arrow B, thereby protecting the exposed surface of poly gate electrode 434. In addition, protection region 612 also touches the side wall of protection cap 432 and side wall spacer 442. On the other hand, when a surface of poly gate electrode 434 is not exposed, the etch removes substantially all of the protection regions 610.

Figure 6C:
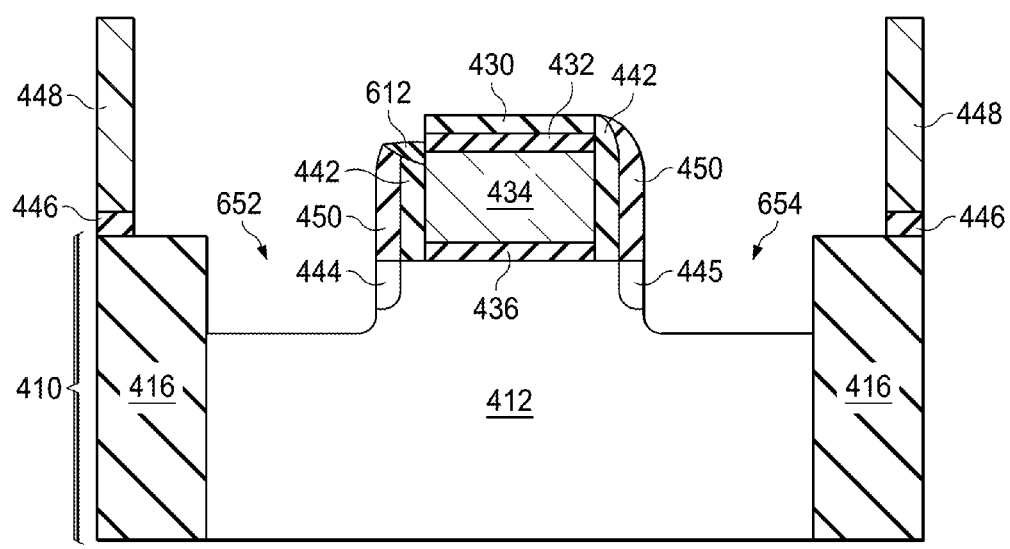

As shown in FIG. 6C, after protection region 612 has been formed, the exposed portions of the single-crystal-silicon PLDD regions 444 and 445, and single-crystal-silicon substrate region 412 are anisotropically etched in a conventional manner to form source and drain trenches 652 and 654. Once the source and drain trenches 652 and 654 have been formed, patterned photoresist layer 448 is removed in a conventional fashion.

Figure 6D:
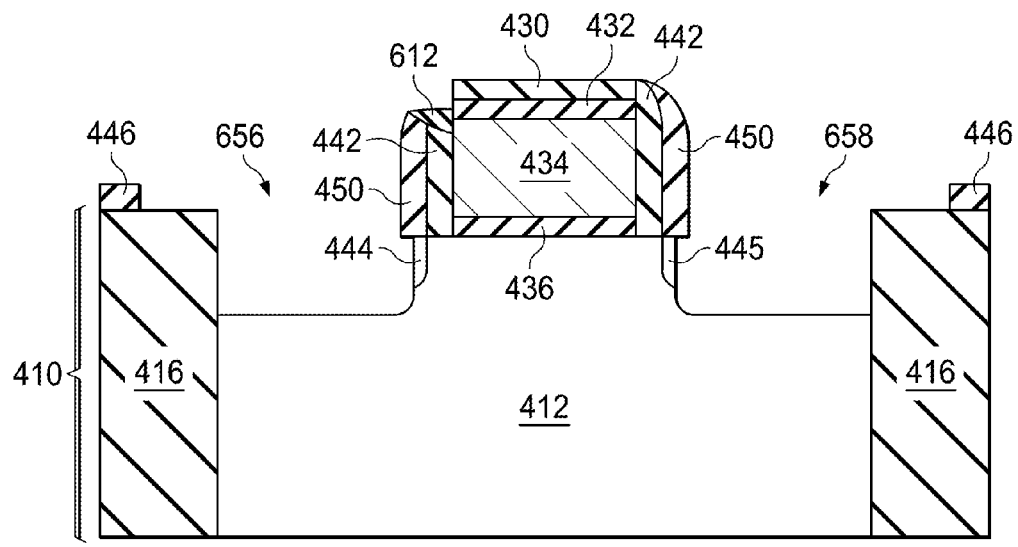
Figure 6E:
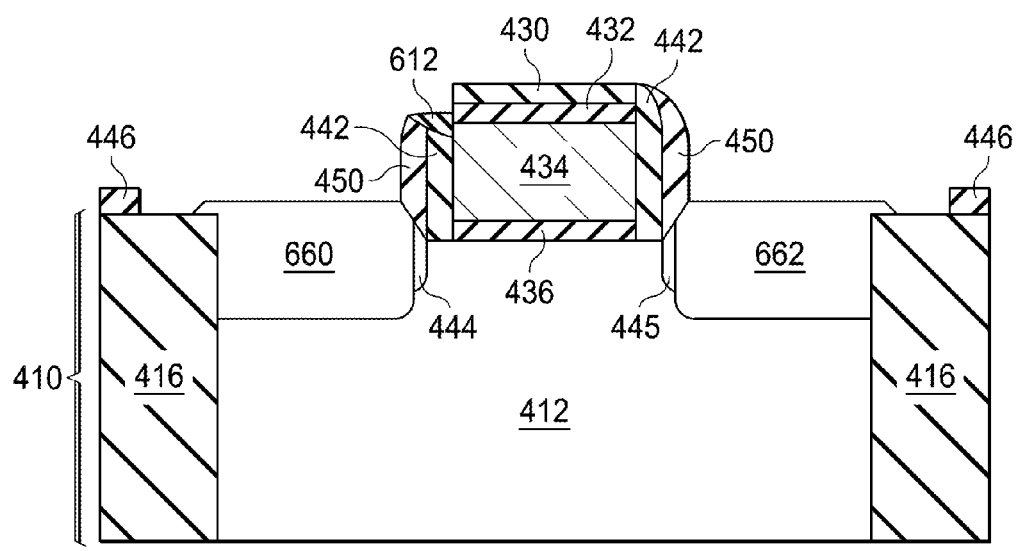
Figure 6F:
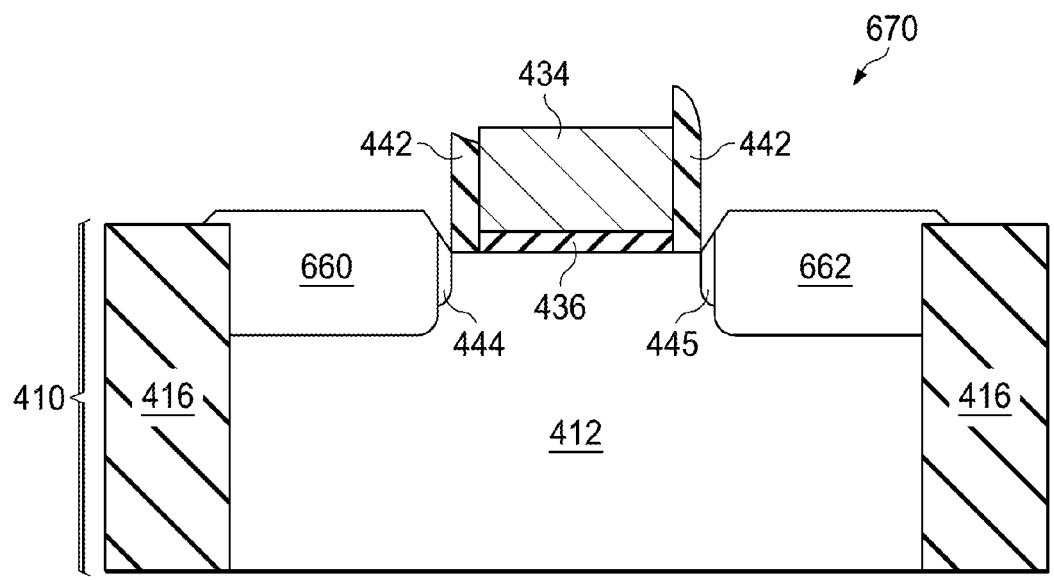

Next, as shown in FIG. 6D, the exposed portions of single-crystal-silicon in the source and drain trenches 652 and 654 are conventionally wet etched to form source and drain cavities 656 and 658. The cavities 656 and 658 are then rinsed and cleaned in a conventional fashion. Following this, as shown in FIG. 6E, p-type silicon germanium is epitaxially grown in a conventional manner to form SiGe source and drain regions 660 and 662 in the source and drain cavities 656 and 658. Next, as shown in FIG. 6F, protection cap 430, protection cap 432, protection layer 446, side wall spacer 450, and protection region 612 are removed in a conventional manner to form a strained-channel PMOS transistor 670.

One of the advantages of method 600 is that in the event that a significant portion of the side wall of protection cap 432 is exposed in addition to the side wall of protection cap 430, thereby increasing the likelihood that protection cap 430 and protection cap 432 will both partially chip or lift off, protection region 612 covers and protects the exposed portions of the side walls.

As a result, protection region 612 significantly reduces the likelihood that protection cap 430 and protection cap 432 will both partially chip or lift off and expose gate electrode 434 during the formation of the SiGe source and drain regions 660 and 662. Another advantage of method 600 is that protection layer 422, which is used to form protection cap 432, and protection layer 610, which is used to form protection region 612, can be deposited in a low-temperature process.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a semiconductor structure comprising:
    forming a polycrystalline (poly) layer on a gate isolation structure, the gate isolation structure touching and lying above a single-crystal silicon region;
    performing a plasma nitridation to convert a surface of the poly layer to silicon nitride; and
    etching a number of layers to form a stacked structure, the number of layers including the poly layer with the surface converted to silicon nitride, the stacked structure including a poly gate electrode formed by etching the poly layer, and a silicon nitride cap formed by etching the surface converted to silicon nitride, the poly gate electrode having a side wall, the silicon nitride cap touching and lying above the poly gate electrode.

2. The method of claim 1 and further comprising forming an inorganic anti-reflective coating (IARC) layer that touches and lies over the surface converted to silicon nitride before the number of layers is etched.

3. The method of claim 2 and further comprising etching the IARC layer to form an IARC hard mask.

4. The method of claim 1 and further comprising forming a non-conductive side wall spacer that touches the side wall of the poly gate electrode.

5. The method of claim 4 wherein the non-conductive side wall spacer touches the nitride cap.

6. The method of claim 4 and further comprising forming a nitride side wall spacer that touches the non-conductive side wall spacer.

7. The method of claim 6 and further comprising:
    etching the single-crystal silicon region to form a source cavity and a drain cavity after the nitride side wall spacer has been formed, the source cavity lying spaced apart from the drain cavity, a channel portion of the single-crystal silicon region lying horizontally between the source cavity and the drain cavity, the channel portion lying directly below the poly gate electrode; and
    simultaneously growing a silicon germanium source region in the source cavity, and a silicon germanium drain region in the drain cavity.

8. The method of claim 6 and further comprising:
    forming a nitride cover layer to touch the nitride side wall spacer and the single-crystal silicon region; and
    etching the nitride cover layer to remove the nitride cover layer from the single-crystal silicon region.

9. The method of claim 8 and further comprising:
    etching the single-crystal silicon region to form a source cavity and a drain cavity after the nitride cover layer has been etched, the source cavity lying spaced apart from the drain cavity, a channel portion of the single-crystal silicon region lying horizontally between the source cavity and the drain cavity, the channel portion lying directly below the poly gate electrode; and
    simultaneously growing a silicon germanium source region in the source cavity, and a silicon germanium drain region in the drain cavity.

10. A method of forming a semiconductor structure comprising:
    forming a polycrystalline (poly) layer on a gate isolation structure, the gate isolation structure touching and lying above a single-crystal silicon region;
    forming a protective layer to touch and lie above the poly layer;
    forming an inorganic anti-reflective coating (IARC) layer to touch and lie above the protective layer, the protective layer and the IARC layer including different materials;
    etching a number of layers to form a stacked structure, the number of layers including the poly layer, the protective layer, and the IARC layer, the stacked structure including a poly gate electrode formed by etching the poly layer, a protective cap formed by etching the protective layer, and an IARC hard mask formed by etching the IARC layer, the poly gate electrode having a side wall, the protective cap touching and lying above the poly gate electrode, the IARC hard mask touching and lying above the protective cap;
    etching the single-crystal silicon region to form a source cavity and a drain cavity after the stacked structure has been formed, the source cavity lying spaced apart from the drain cavity, a channel portion of the single-crystal silicon region lying horizontally between the source cavity and the drain cavity, the channel portion lying directly below the poly gate electrode; and
    simultaneously growing a silicon germanium source region in the source cavity, and a silicon germanium drain region in the drain cavity.

11. The method of claim 10 wherein the protective layer includes silicon nitride.

12. The method of claim 10 and further comprising forming a non-conductive side wall spacer that touches the side wall of the poly gate electrode.

13. The method of claim 12 wherein the non-conductive side wall spacer touches the protective cap.

14. The method of claim 12 and further comprising forming a non-conductive side wall structure that touches the non-conductive side wall spacer.

15. The method of claim 14 wherein the single-crystal silicon region is etched to form a source cavity and a drain cavity after the non-conductive side wall structure has been formed.

16. The method of claim 15 wherein the non-conductive side wall structure includes silicon nitride.

17. The method of claim 14 and further comprising:
    forming a protective cover layer to touch the non-conductive side wall structure and the single-crystal silicon region; and
    etching the protective cover layer to remove the protective cover layer from the single-crystal silicon region.

18. The method of claim 17 wherein the single-crystal silicon region is etched to form a source cavity and a drain cavity after the protective cover layer has been etched.

19. A method of forming a semiconductor structure comprising:
    forming a stacked structure that touches a single-crystal silicon region, the stacked structure including a polycrystalline (poly) gate electrode that is electrically isolated from the single-crystal silicon region, the poly gate electrode having a side wall;

forming a non-conductive side wall spacer that touches the side wall of the poly gate electrode;

forming a non-conductive side wall structure that touches the non-conductive side wall spacer;

performing a plasma nitridation such that any exposed surface of the poly gate electrode is converted to a silicon nitride layer; and etching the silicon nitride layer to remove the silicon nitride layer from the single-crystal silicon region.

20. The method of claim 19 and further comprising etching the single-crystal silicon region to form a source cavity and a drain cavity after the silicon nitride layer has been etched, the source cavity lying spaced apart from the drain cavity, a channel portion of the single-crystal silicon region lying horizontally between the source cavity and the drain cavity, the channel portion lying directly below the poly gate electrode.

* * * * *